(12) United States Patent
Holmes et al.

(10) Patent No.: US 11,220,742 B2
(45) Date of Patent: Jan. 11, 2022

(54) LOW TEMPERATURE LIFT-OFF PATTERNING FOR GLASSY CARBON FILMS

(71) Applicant: INTERNATIONAL BUSINESS MACHINES CORPORATION, Armonk, NY (US)

(72) Inventors: Steven J. Holmes, Ossining, NY (US); Deborah A. Neumayer, Danbury, CT (US); Stephen Bedell, Wappingers Falls, NY (US); Devendra K. Sadana, Pleasantville, NY (US); Damon Farmer, White Plains, NY (US); Nathan P. Marchack, New York, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 94 days.

(21) Appl. No.: 16/362,128

(22) Filed: Mar. 22, 2019

(65) Prior Publication Data

US 2020/0299832 A1   Sep. 24, 2020

(51) Int. Cl.
  *C23C 16/04*  (2006.01)
  *C23C 16/56*  (2006.01)
  *C23C 16/50*  (2006.01)
  *C23C 16/26*  (2006.01)

(52) U.S. Cl.
  CPC .......... *C23C 16/042* (2013.01); *C23C 16/26* (2013.01); *C23C 16/50* (2013.01); *C23C 16/56* (2013.01)

(58) Field of Classification Search
  CPC ....... C23C 16/042; C23C 16/26; C23C 16/50; C23C 16/56
  See application file for complete search history.

(56) References Cited

U.S. PATENT DOCUMENTS 4,614,564 A * 9/1986 Sheldon .............. H01L 21/0337
                                                        117/95
4,816,338 A   3/1989 Terasaki et al.
7,371,425 B2  5/2008 Rathenow et al.
(Continued)

FOREIGN PATENT DOCUMENTS

CN     102618841 A  *  8/2012
JP      62117365 A  *  5/1987  ....... H01L 27/14665

OTHER PUBLICATIONS

Parker, "Inductively Coupled Plasma Etching of Bulk Titanium for MEMS Applications", 2005, p. C675-C683 (Year: 2005).*
(Continued)

*Primary Examiner* — Gordon Baldwin
*Assistant Examiner* — Christina D McClure
(74) *Attorney, Agent, or Firm* — Cantor Colburn LLP; Jeffrey S LaBaw

(57) ABSTRACT

A method of fabricating a glassy carbon film is described. The method includes forming a soluble layer on a substrate, forming a lift-off stack that includes a lift-off mask layer and a hard-mask layer, and forming a pattern in the lift-off stack to expose a portion of the soluble layer. The exposed portions of the soluble layer are removed to expose a portion of the substrate. A carbon material is over the exposed portion of the substrate. The soluble layer is dissolved in a solvent, and the lift-off stack is lifted-off.

11 Claims, 12 Drawing Sheets

(56) References Cited

U.S. PATENT DOCUMENTS

| | | | |
|---|---|---|---|
| 8,349,547 B1 | 1/2013 | Burckel et al. | |
| 9,595,436 B2 | 3/2017 | Beasley et al. | |
| 9,862,608 B1 | 1/2018 | Polsky et al. | |
| 2004/0209470 A1* | 10/2004 | Bajorek | B82Y 10/00 438/689 |
| 2006/0018360 A1* | 1/2006 | Tai | G01J 5/20 374/121 |
| 2007/0107842 A1* | 5/2007 | Ishimatsu | C04B 35/524 156/345.11 |
| 2009/0098702 A1* | 4/2009 | Kirkpatrick | H01L 21/3086 438/296 |
| 2010/0006812 A1* | 1/2010 | Xu | H01L 27/2481 257/2 |
| 2010/0024873 A1* | 2/2010 | Mahrize | H01L 31/03762 136/255 |
| 2011/0089141 A1* | 4/2011 | Tanaka | B81C 1/00103 216/47 |
| 2014/0024219 A1* | 1/2014 | Jung | H01L 21/31144 438/703 |
| 2014/0335700 A1* | 11/2014 | Denifl | H01L 21/0217 438/763 |
| 2016/0073920 A1* | 3/2016 | Kassegne | A61B 5/04001 600/395 |
| 2018/0145226 A1* | 5/2018 | Totani | H01L 33/0075 |

OTHER PUBLICATIONS

JP-62117365-A, machine translation, originally publshed 1987, p. 1-2 (Year: 1987).*

CN-102618841-A, machine translation, originally published 2012, p. 1-7 (Year: 2012).*

Kalijadis, A., et al., "The Effect of Boron Incorporation on the Structure and Properties of Glassy Carbon", 2011, Carbon, 49, p. 2671-2678 (Year: 2011).*

Diana Elizabeth García-Rodríguez et al., "Copper electrodeposition on glassy carbon and highly oriented pyrolytic graphite substrates from perchlorate solutions," Qufmica Nova, vol. 35, No. 4, 2012, pp. 699-704.

Maria Vomero et al., "A novel pattern transfer technique for mounting glassy carbon microelectrodes on polymeric flexible substrates," Journal of Micromechanics and Microengineering, vol. 26, No. 2, 2016, 025018.

Olivier J. A. Schueller et al., "Fabrication of glassy carbon microstructures by soft lithography," Sensors and Actuators A, vol. 72, No. 2, 1999, pp. 125-139.

Roya Mohammadzadeh Kakhki, "A review to recent developments in modification of carbon fiber electrodes," Arabian Journal of Chemistry, 2014, 12 pages.

* cited by examiner

1902 FORM SOLUBLE LAYER

1904 FORM LIFT-OFF MASK LAYER

1906 FORM HARD-MASK LAYER

1908 FORM RESIST PATTERN

1910 FORM A PATTERN IN THE HARD-MASK LAYER

1912 REMOVE RESIST PATTERN

1914 REMOVE EXPOSED PORTIONS OF THE LIFT-OFF MASK LAYER

1916 REMOVE EXPOSED PORTIONS OF THE SOLUBLE LAYER

1918 DEPOSITING A CARBON MATERIAL

1920 DISSOLVING THE SOLUBLE LIFT-OFF LAYER

1922 LIFTING-OFF THE LIFT-OFF MASK LAYER AND THE HARD-MASK LAYER

FIG. 19

LOW TEMPERATURE LIFT-OFF PATTERNING FOR GLASSY CARBON FILMS

BACKGROUND

The present invention generally relates to fabrication methods and resulting structures of glassy carbon films. More specifically, the present invention relates to a low temperature method of fabricating glassy carbon films and resulting structures.

Electrochemistry studies the relationship between electricity and identifiable chemical or biochemical changes. For example, an ionic species of interest in a solution can be identified and measured by analyzing electric charges that move between biosensors in the solution and the various ionic species in the solution. A biosensor can be defined as an analytical device that converts a biological or bio/chemical response to an electric signal. An example biosensor configuration uses a compact analytical device such as an electrode to generate a measurable electrical parameter (e.g., current) based at least in part on detecting and/or measuring one or more analytes. The electrode can incorporate a biological or biologically derived recognition element to enhance and/or target the electrode's detection sensitivity. Glass-like carbon, which is often referred to as glassy carbon or vitreous carbon, is considered an optimal material for forming the electrodes used in biosensors.

SUMMARY

Embodiments of the present invention are directed to a method for fabricating a glassy carbon film on a substrate. The method includes forming a soluble layer on a substrate, forming a lift-off stack that includes a lift-off mask layer and a hard-mask layer, forming a pattern in the lift-off stack to expose a portion of the soluble layer, removing exposed portions of the soluble layer to expose a portion of the substrate, depositing a carbon material over the exposed portion of the substrate, dissolving the soluble layer in a solvent, and lifting-off the lift-off stack.

Embodiments of the present invention are also directed to a method for fabricating a glassy carbon electrode on a substrate. The method includes forming a soluble layer on a substrate, forming a lift-off stack comprising a lift-off mask layer and a hard-mask layer, forming a pattern in the lift-off stack to expose a portion of the soluble layer, removing exposed portions of the soluble layer to expose a portion of the substrate, wherein the removing also forms an undercut portion under the lift-off mast layer where some of the unexposed portion of the soluble layer is removed, depositing a carbon material over the exposed portion of the substrate, dissolving the soluble layer in a solvent, and lifting-off the lift-off stack.

Additional technical features and benefits are realized through the techniques of the present invention. Embodiments and aspects of the invention are described in detail herein and are considered a part of the claimed subject matter. For a better understanding, refer to the detailed description and to the drawings.

BRIEF DESCRIPTION OF THE DRAWINGS

The specifics of the exclusive rights described herein are particularly pointed out and distinctly claimed in the claims at the conclusion of the specification. The foregoing and other features and advantages of the embodiments of the invention are apparent from the following detailed description taken in conjunction with the accompanying drawings in which:

FIGS. 1-7 depict cross-sectional views of a device structure after fabrication operations in accordance with aspects of the invention, in which:

FIG. 1 depicts a cross-sectional side view of a device after an initial fabrication stage according to embodiments of the invention;

FIG. 2 depicts a cross-sectional side view of a device after a fabrication stage according to embodiments of the invention;

FIG. 3 depicts a cross-sectional side view of a device after a fabrication stage according to embodiments of the invention;

FIG. 4 depicts a cross-sectional side view of a device after a fabrication stage according to embodiments of the invention;

FIG. 5 depicts a cross-sectional side view of a device after a fabrication stage according to embodiments of the invention;

FIG. 6 depicts a cross-sectional side view of a device after a fabrication stage according to embodiments of the invention; and FIG. 7 depicts a cross-sectional side view of a device after a fabrication stage according to embodiments of the invention;

FIG. 19 depicts a flow diagram illustrating a methodology according to embodiments of the invention.

Figure 1:
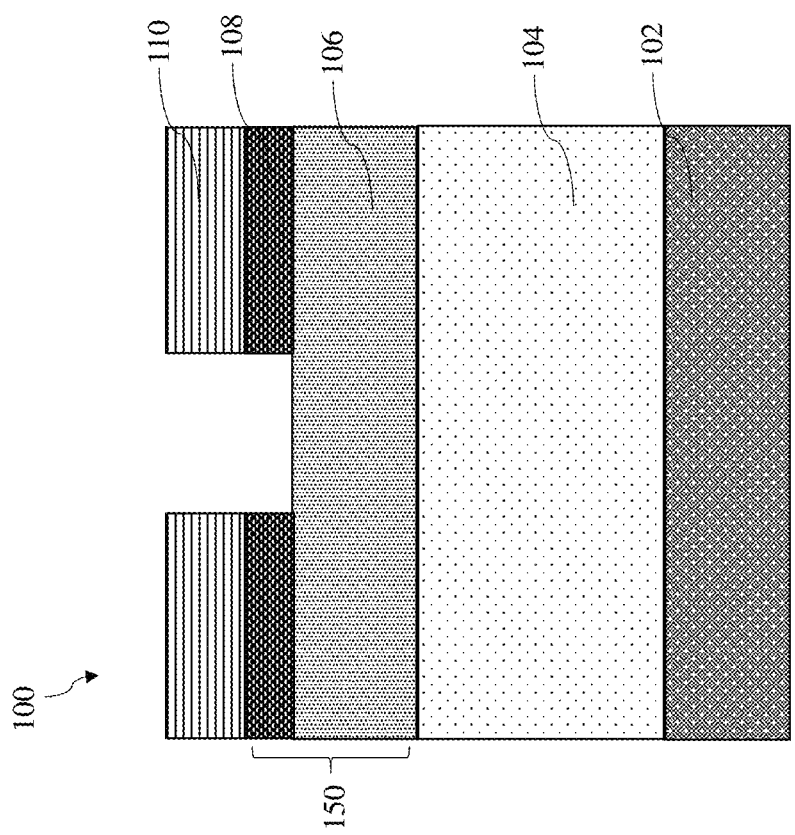

The diagrams depicted herein are illustrative. There can be many variations to the diagram or the operations described therein without departing from the spirit of the invention. For instance, the actions can be performed in a differing order or actions can be added, deleted or modified. Also, the term "coupled" and variations thereof describes having a communications path between two elements and does not imply a direct connection between the elements with no intervening elements/connections between them. All of these variations are considered a part of the specification.

In the accompanying figures and following detailed description of the disclosed embodiments, the various elements illustrated in the figures are provided with two or three digit reference numbers. With minor exceptions, the leftmost digit(s) of each reference number correspond to the figure in which its element is first illustrated.

DETAILED DESCRIPTION

For the sake of brevity, conventional techniques related to semiconductor device and integrated circuit (IC) fabrication may or may not be described in detail herein. Moreover, the various tasks and process steps described herein can be incorporated into a more comprehensive procedure or process having additional steps or functionality not described in detail herein. In particular, various steps in the manufacture of semiconductor devices and semiconductor-based ICs are well known and so, in the interest of brevity, many conventional steps will only be mentioned briefly herein or will be omitted entirely without providing the well-known process details.

Turning now to an overview of technologies that are more specifically relevant to aspects of the invention, biosensors are analytical tools that are useful for a variety of applications including medical diagnostics, treatments of diseases, food safety, agricultural and environmental monitoring, security, defense, and the like. There are many different types of biosensors, which are typically categorized based on the biosensor's biological recognition elements and transducer elements. For example, an example biosensor configuration includes a biological sensitive recognition element (e.g., antibodies, nucleic acids, enzymes, or aptamers) immobilized on a physicochemical transducer and connected to a detector to identify the presence, concentrations and/or kinetics of one or more specific analytes in a sample. In biosensors formed from glass-like carbon electrodes, the glass-like carbon electrode can function as both the recognition element and the transducer. The specificity and selectivity of the biosensor is determined by the catalytic or affinity properties of the biological recognition element. The signal originating from the interaction between the analyte of interest and the biological recognition element is then transformed by a transducer to an optical or electrical readout. Biosensors are consider to be more reliable, accurate, cost effective, and easy to use compared to other conventional lab-based detection techniques due to their portability, reusability, real-time response, and high specificity, sensitivity and selectivity.

Glass-like carbon, which is often referred to as glassy carbon or vitreous carbon, is considered an optimal material for forming the electrodes used in biosensing systems. Glass-like carbon is a non-graphitizing carbon that combines glassy and ceramic properties with those of graphite. The useful properties of glass-like carbon in biosensor applications can include high temperature resistance, hardness (e.g., 7 Mohs), low density, low electrical resistance, low friction, low thermal resistance, extreme resistance to chemical attack and impermeability to gases and liquids.

It is a challenge to fabricate a glassy carbon electrode or film using methodologies that are compatible with traditional semiconductor manufacturing materials and processes. Traditional methods of making glassy carbon use polymers that require a very high temperature anneal, for example, 900° C. for 2 hours. Such traditional processes cause large film shrinkage (70-80%) due to outgassing during anneal. The traditional process also suffers from limitations such as poor adhesion and poor compatibility with other materials that cannot withstand the high temperature anneal.

Lift-off processing can offer a simple patterning process that is compatible with a wide range of substrates and has minimal substrate damage as compared to RIE (Reactive Ion Etch) or strip processes. However, lift off processing for high temperature material deposition is not possible due to the thermal instability of the conventional organic lithography materials. A lift off process for glassy carbon electrodes and films is desirable.

Turning now to an overview of the aspects of the invention, one or more embodiments of the invention address the above-described shortcomings of the prior art by providing a lift off process for glassy carbon electrodes and films. More specifically, aspects of the invention provide fabrication methods and resulting structures in which glassy carbon films and electrodes are effectively formed by chemical vapor deposition (CVD) and/or PECVD (Plasma Enhanced Chemical Vapor Deposition) of a carbon source material at low temperatures with mild anneals using a lift-off process. The glassy carbon films prepared according to one or more embodiments of the present invention have minimal film shrinkage, good adhesion, and good conductivity.

In one or more embodiments of the present invention, the glassy carbon film is prepared by PECVD of benzene. The glassy carbon films prepared by the PECVD of benzene, according to one or more embodiments of the present invention, provide superior conductivity, by 1000× (compared to traditional methods), at lower process temperatures (e.g. 300-700° C.), with low film shrinkage (e.g. 6-10%), and good adhesion to the semiconductor substrates.

In one or more embodiments of the present invention, the glassy carbon films are formed by CVD of a carbon source without plasma.

In one or more embodiments of the present invention, the glassy carbon films are formed by PECVD of a carbon source. The PECVD of a carbon source utilizes capacitively coupled high frequency radio frequency plasma at pressures from 0.5 to 200 torr, powers from 5 to 1500 watts, at temperatures from 300 to 700° C. In one or more embodiments, benzene is used as the carbon source, at 8 torr, 20 to 1000 watts at 550° C. The resultant glassy carbon film can be formed to include $sp^2$ bonded carbon. The infrared spectrum of the glassy carbon films is essentially (i.e., substantially) free of absorptions associated with C—H and $sp^3$ bonded carbon with a minimum of terminal dangling bonds. Accordingly, the IR spectra of provided material are substantially free of peaks between 2800-3100 $cm^{-1}$ associated with $CH_x$ stretch and are free of peaks at 2957 $cm^{-1}$ and 2869 $cm^{-1}$ associated with $sp^3$ $CH_3$ bonding and a peak at 2922 $cm^{-1}$ associated with $sp^3$ $CH_2$. In one or more embodiments, at radio frequency powers greater than 300 watts and at high deposition rates, a peak at 3048 $cm^{-1}$ associated with sp² CH bonding is observed. Typically, the deposited glassy carbon material has an IR spectra with peaks at 1580 and a weaker sub-peak at 1435 cm$^{-1}$ associated with C=C aromatic bonding. Typically, the raman spectra of the provided glassy carbon material has a doublet of sharp narrow peaks at 1340 and 1600 cm$^{-1}$ associated with the disordered (D) and graphite (G) bands respectively. The G band is an in-plane vibrational mode involving the sp² hybridized carbon atoms in a graphene sheet. The D band represents a ring breathing mode from sp² 6 membered carbon rings adjacent to a graphene edge or a defect. Also observed is a weak broad doublet 2200-3200 cm$^{-1}$ associated with double resonant overtones of the D and G peaks, 2D (2625 cm−1) and D+G (2925 cm−1) bands. In one or more embodiments, the intensity of the D band is greater than the intensity of the G band and 2D and D+G peaks in the doublet are broad and approximately equal in intensity. The sharpness of the G and D peaks are associated with ordering of the glassy carbon and greater intensity of the D band is associated with greater retention of 6 membered rings in the glassy carbon.

Turning now to a more detailed description of aspects of the present invention, FIGS. 1-7 are diagrams illustrating a method of fabricating a glassy carbon film on a substrate according to one or more embodiments of the present invention.

FIG. 1 depicts a cross-sectional side view of a device 100 after an initial fabrication stage according to one or more embodiments of the invention. As shown in FIG. 1, the device 100 includes a substrate 102, a soluble layer 104, a lift-off stack 150 that includes a lift-off mask layer 106 and a hard-mask layer 108. A resist pattern 110 is formed on the hard-mask layer 108.

The substrate 102 can be a silicon (Si) substrate, although other materials or substrates can be used. In one or more embodiment of the present invention, the substrate is selected from the group consisting of silicon (Si), GaN, sapphire, and combinations thereof.

The soluble layer 104 is soluble in a solvent. In one or more embodiments of the invention, the solvent is water or diluted hydrogen fluoride solution. In one or more embodiments of the present invention, the soluble layer 104 includes an oxide material. The oxide material can be silicon oxide, germanium oxide, a blend of silicon-germanium oxides, tungsten oxide, or any other suitable oxide material. In one or more embodiments of the present invention, the soluble layer 104 includes a blend of 70-80 atomic % germanium oxide and the remaining silicon oxide.

The layer 106 is a lift-off mask layer. In one or more embodiments of the present invention, the layer 106 includes silicon nitride. The layer 108 is a hard mask layer. In one or more embodiments of the invention, the hard mask layer 108 is a titanium hard mask layer. The lift-off mask layer 106 and the hard mask layer 108 together form the lift-off stack 150.

In one or more embodiments of the present invention, the layers 104, 106, 108, and 110 on substrate 102 are formed by epitaxially growing one layer and then the next until the desired number and desired thicknesses of the layers are achieved. Epitaxial materials can be grown from gaseous or liquid precursors. Epitaxial materials can be grown using vapor-phase epitaxy (VPE), molecular-beam epitaxy (MBE), liquid-phase epitaxy (LPE), or other suitable process.

The terms "epitaxial growth and/or deposition" and "epitaxially formed and/or grown" mean the growth of a semiconductor material (crystalline material) on a deposition surface of another semiconductor material (crystalline material), in which the semiconductor material being grown (crystalline overlayer) has substantially the same crystalline characteristics as the semiconductor material of the deposition surface (seed material). In an epitaxial deposition process, the chemical reactants provided by the source gases are controlled and the system parameters are set so that the depositing atoms arrive at the deposition surface of the semiconductor substrate with sufficient energy to move about on the surface such that the depositing atoms orient themselves to the crystal arrangement of the atoms of the deposition surface. Therefore, an epitaxially grown semiconductor material has substantially the same crystalline characteristics as the deposition surface on which the epitaxially grown material is formed. For example, an epitaxially grown semiconductor material deposited on a {100} orientated crystalline surface will take on a {100} orientation. In one or more embodiments of the invention, epitaxial growth and/or deposition processes are selective to forming on semiconductor surfaces, and generally do not deposit material on exposed surfaces, such as silicon dioxide or silicon nitride surfaces.

Figure 2:
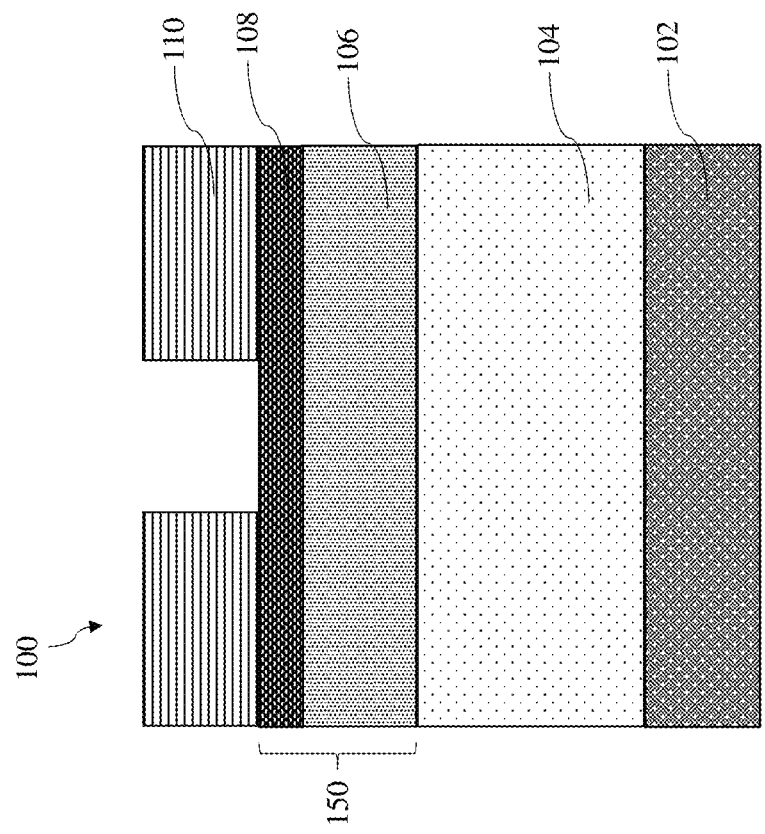

FIG. 2 depicts a cross-sectional side view of the device 100 after a next fabrication stage according to one or more embodiments of the invention. As shown in FIG. 2, exposed portions of the hard mask layer 108 are etched by reactive ion etching (ME) process. In one or more embodiments of the invention, chlorine plasma ME process is used for etching of the hard mask layer 108.

Figure 3:
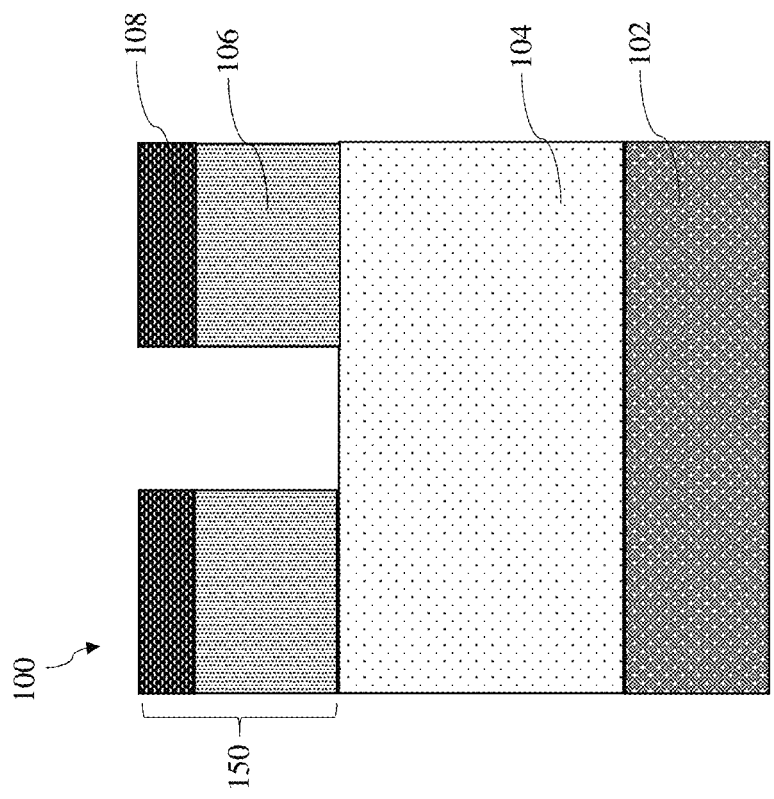

FIG. 3 depicts a cross-sectional side view of the device 100 after a next fabrication stage according to some embodiments of the invention. As shown in FIG. 3, exposed portions of the lift-off mask layer 106 are etched by ME. The etching process also removes the resist layer 110. In one or more embodiments of the invention, fluorine plasma ME process is used for etching of the lift-off mask layer 106.

Figure 4:
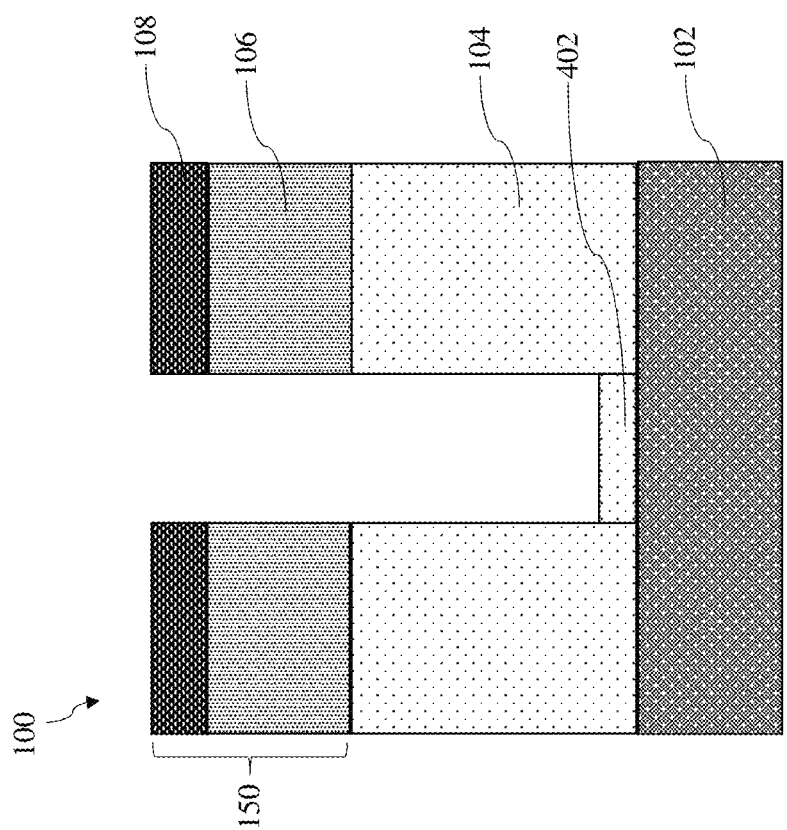

FIG. 4 depicts a cross-sectional side view of the device 100 after a next fabrication stage according to some embodiments of the invention. As shown in FIG. 4, of the exposed portion of soluble layer 104 is partially etched. In one or more embodiments of the invention, about 90% thickness of the exposed portion of the soluble layer 104 is etched. The remaining part of the exposed portion of the soluble layer 104 is indicated as 402 in FIG. 4. In one or more embodiments of the invention, fluorine plasma RIE process is used for etching of the soluble layer 104.

Figure 5:
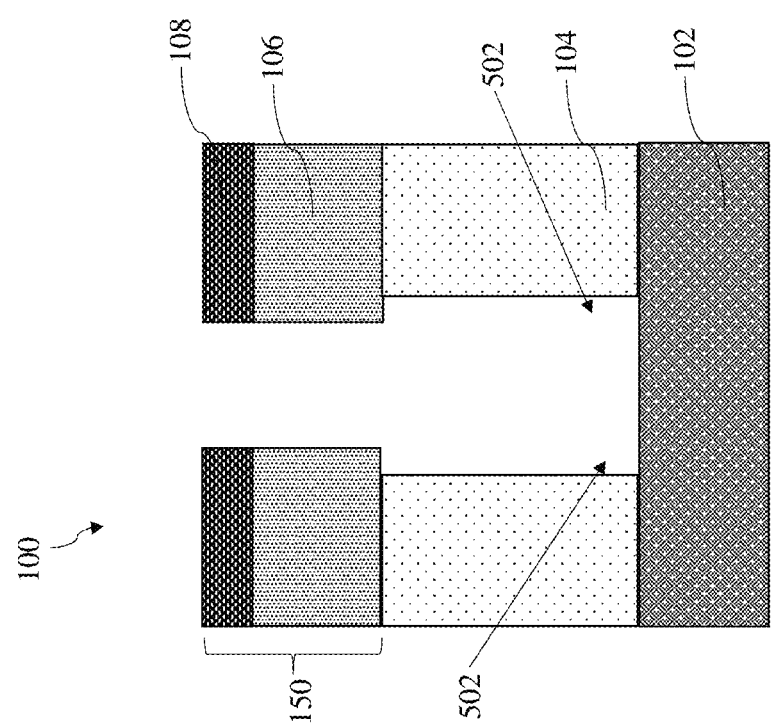

FIG. 5 depicts a cross-sectional side view of the device 100 after a next fabrication stage according to some embodiments of the invention. As shown in FIG. 5, the remaining part 402 of the exposed portion of the soluble layer 104 is removed by wet-etching. In one or more embodiments, the wet-etching is carried out using water or diluted hydrofluoric acid (DHF). As shown in FIG. 5, the wet-etch process also removes some part of the unexposed portions of the soluble layer 104 under the lift-off mask layer 106 thereby creating undercut portions 502.

Figure 6:
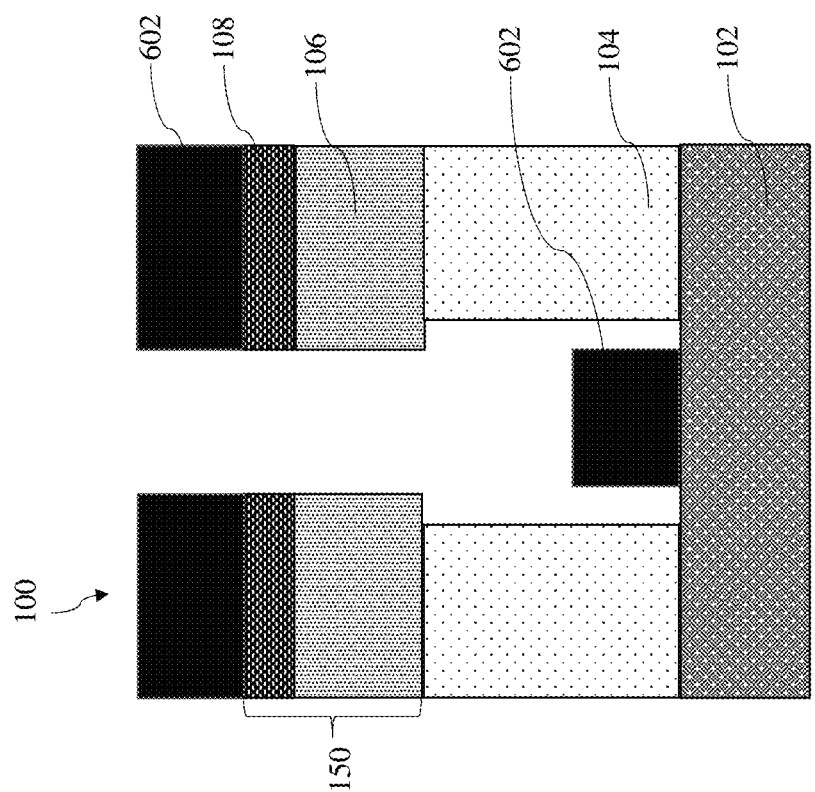

FIG. 6 depicts a cross-sectional side view of the device 100 after a next fabrication stage according to some embodiments of the invention. As shown in FIG. 6, a layer 602 of carbon-material is deposited on the device 100. In one or more embodiments of the invention, the carbon material can be deposited using a plasma enhanced chemical vapor deposition (PECVD) process or a chemical vapor deposition process (CVD). In one or more embodiments, the source gas to produce the glassy carbon material is benzene. Other suitable source gases include toluene, xylene, anthracene, phenylbenzene, methylphenylbenzen, diphenylacetylene, ethylbenzene, acetylene, propyne, and similar hydrocarbon materials with a high proportion of carbon composition, minimal hydrogen composition, and $sp^2$ hybridized carbon bonding. In one or more embodiments of the invention, the glassy carbon layer is deposited by a low-temperature PECVD process. The low temperature PECVD process can deposit the carbon material layer 602 at a temperature between 400 to 900° C. The carbon material layer 602 can have a suitable thickness in the range of 400 to 900 nanometers.

In one or more embodiments of the invention, the carbon material is benzene, and the glassy carbon layer 602 is deposited by a PECVD process at 550° C. As shown in FIG. 6, the layer 602 is deposited on the hard mask layer 108 as well as on the exposed portion of the substrate 102. As shown in FIG. 6, the carbon material is not deposited in the undercut portions 502.

Figure 7:
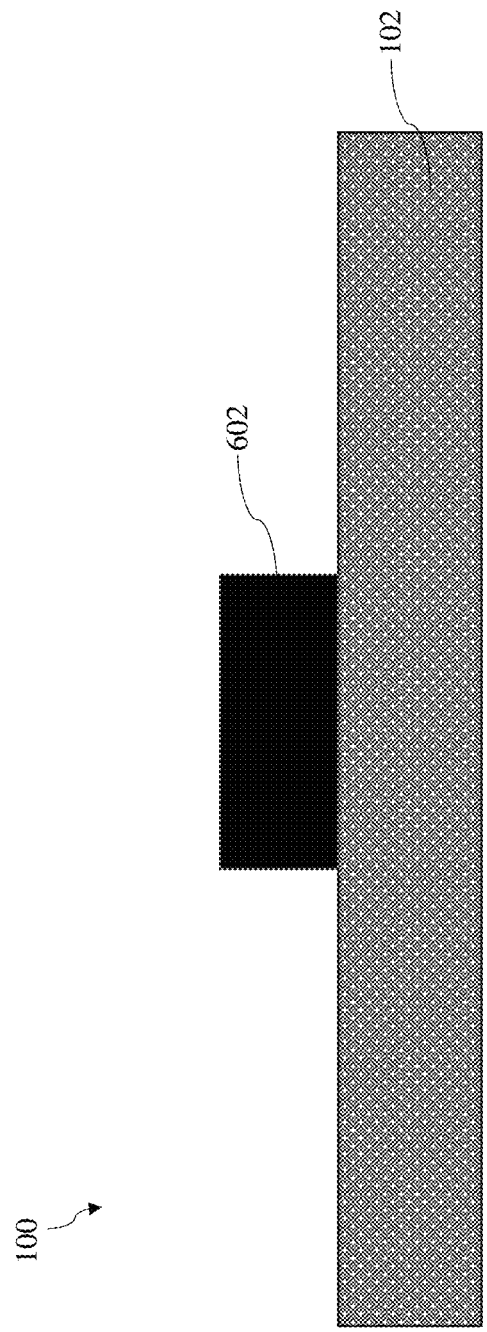

FIG. 7 depicts a cross-sectional side view of the device 100 after a next fabrication stage according to some embodiments of the invention. As shown in FIG. 7, the soluble layer 104 is removed by using water or DHF solution. The layers 106, 108, and portions of layer 602 located over the hard mask layer 108 are also removed by lift-off process. In other words, the lift-off stack (including layers 106 and 108) is lifted off and removed. As shown in FIG. 7, a carbon layer 602 of desired pattern is thus formed by a low-temperature PECVD followed by a lift-off process. Since the carbon material is not deposited into the undercut portion 502, void is left between adjacent structures of carbon layers 602.

Figure 8:
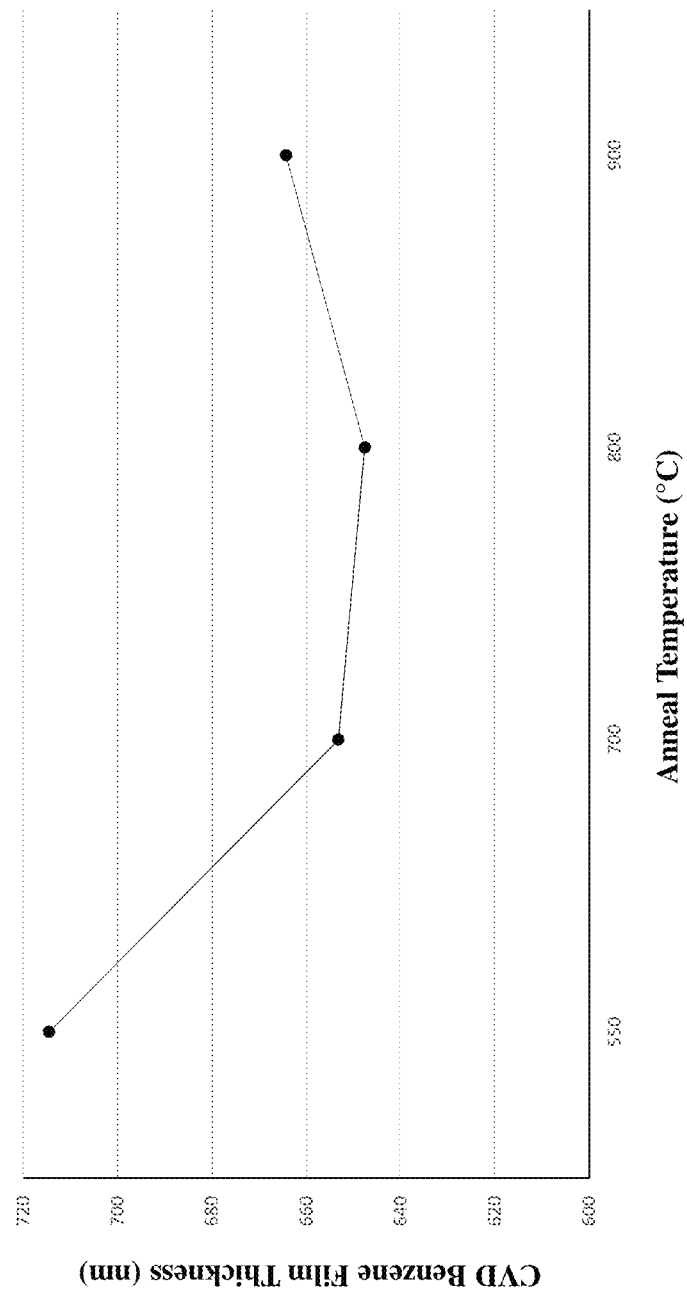
FIG. 8 depicts a chart showing a relationship between plasma enhanced chemical vapor deposited (PECVD) glassy carbon film thickness (in nanometers) and annealing temperature (in degree centigrade), according to embodiments of the invention.

In one or more embodiments of the invention, the layer 602 is formed by PECVD of benzene at 550° C. In one or more embodiments, the glassy carbon layer 602 is subsequently subjected to annealing at a suitable temperature for a suitable time. In one or more embodiments, the annealing is carried out at a temperature between 600 and 1000° C. In one or more embodiments, the annealing is carried out for a period of 30 minutes to 4 hours. In one or more embodiments, the glassy carbon layer 602 is subjected to annealing at 700° C. for one hour. In one or more embodiments, the glassy carbon layer 602 is subjected to annealing at 800° C. for one hour. In one or more embodiments, the glassy carbon layer 602 is subjected to annealing at 900° C. for one hour. FIG. 8 depicts a chart showing a relationship between chemical vapor deposition (PECVD) glassy carbon film thickness (in nanometers) and anneal temperature (in degree centigrade), according to one or more embodiments of the invention.

Figure 9:
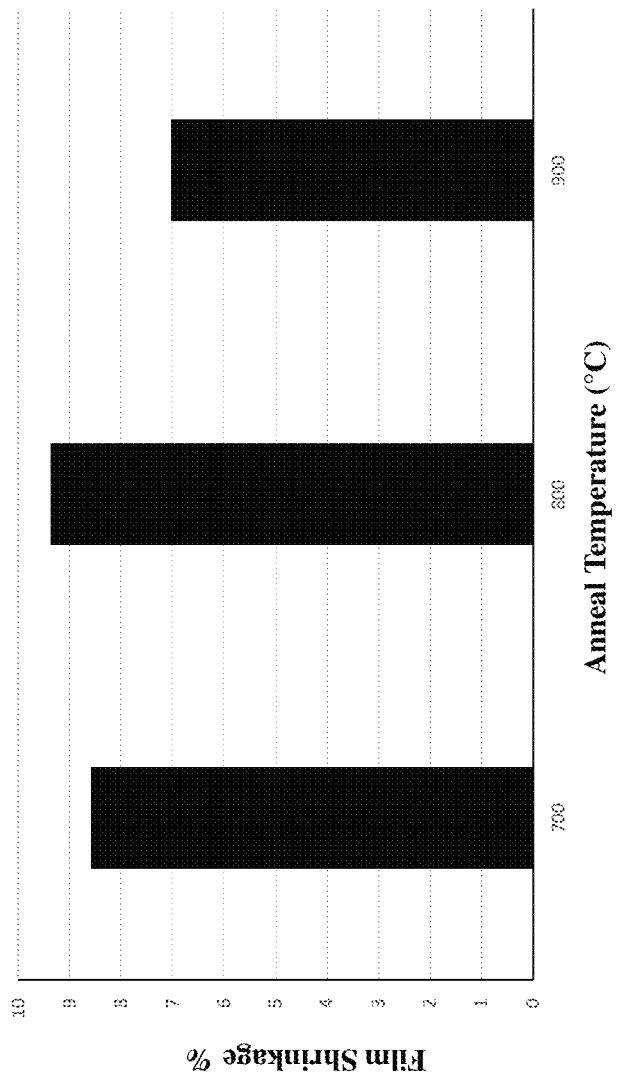
FIG. 9 depicts a chart showing a relationship between film shrinkage (in percent) and anneal temperature (in degree centigrade), according to embodiments of the invention.

FIG. 9 depicts a chart showing a relationship between film shrinkage (in percent) and anneal temperature (in degree centigrade), according to one or more embodiments of the invention. As shown in FIG. 9, according to one or more embodiments of the invention, the film shrinkage is within the range of 7 to 10%. It is noted that the film shrinkage according to one or more embodiments of the invention is much less compared to conventional methods.

Figure 10:
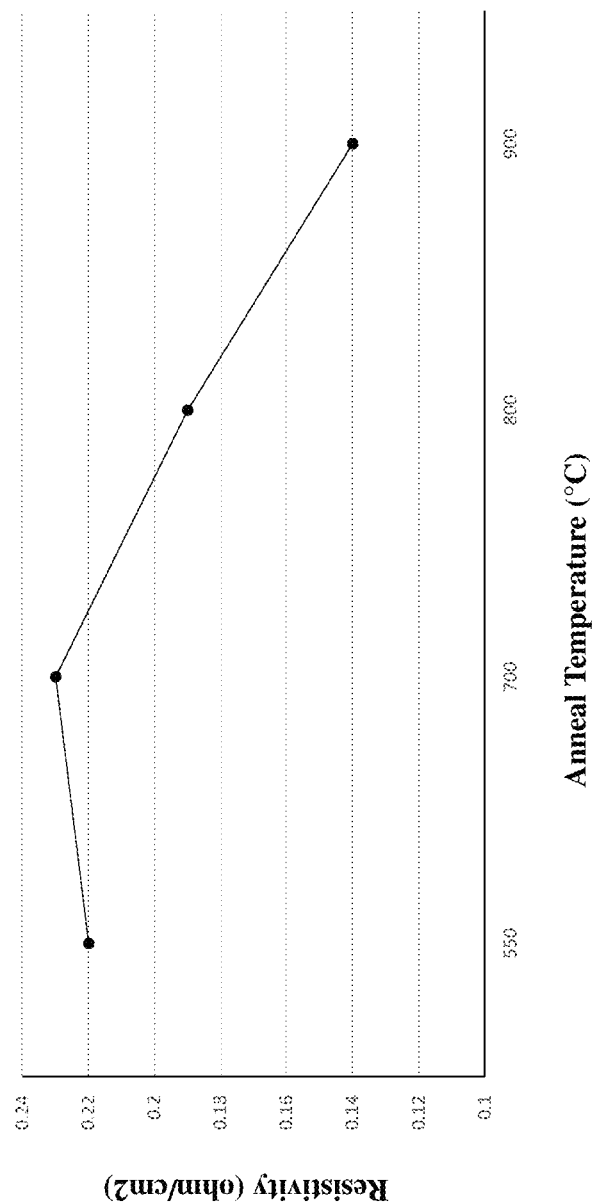
FIG. 10 depicts a chart showing a relationship between resistivity (in ohm per square centimeter) and anneal temperature (in degree centigrade), according to embodiments of the invention.

FIG. 10 depicts a chart showing relationship between resistivity (in ohm per square centimeter) and anneal temperature (in degree centigrade), according to one or more embodiments of the invention. As shown in FIG. 10, the resistivity usually decreases with an increase in annealing temperature.

In one or more embodiments, the layer 602 is formed by PECVD of benzene at 550° C. The layer 602 can have a suitable thickness in the range of 10 to 900 nanometers. The thickness of layer 602 is decided based on intended application. Depending on the application, the thickness of layer 602 can be as thin as 10-30 nm or as thick as several microns. The thicknesses of the materials in the lift off stack can also be changed to accommodate a different target thickness of glassy carbon. In one or more embodiments of the invention, materials other than glassy carbon, for example, metallic conductors or superconductors are also deposited on layer 602. In one or more embodiments, the glassy carbon layer 602 has a thickness of 200-800 nm. In one or more embodiments, the glassy carbon layer 602 has a thickness of 700 nm.

Figure 12:
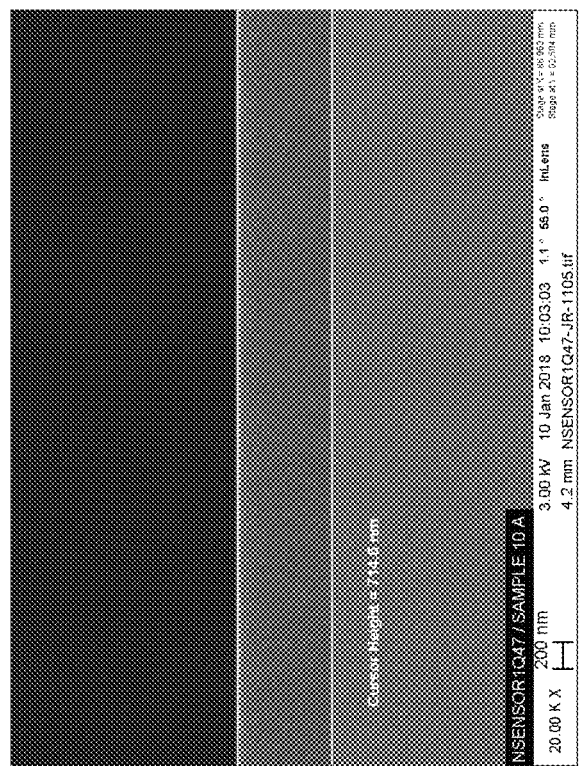
FIG. 12 depicts a scanning electron microscope (SEM) image of a 700 nm glassy carbon film PECVD deposited on a bare silicon wafer at 550° C. with no annealing, according to embodiments of the invention.
Figure 11:
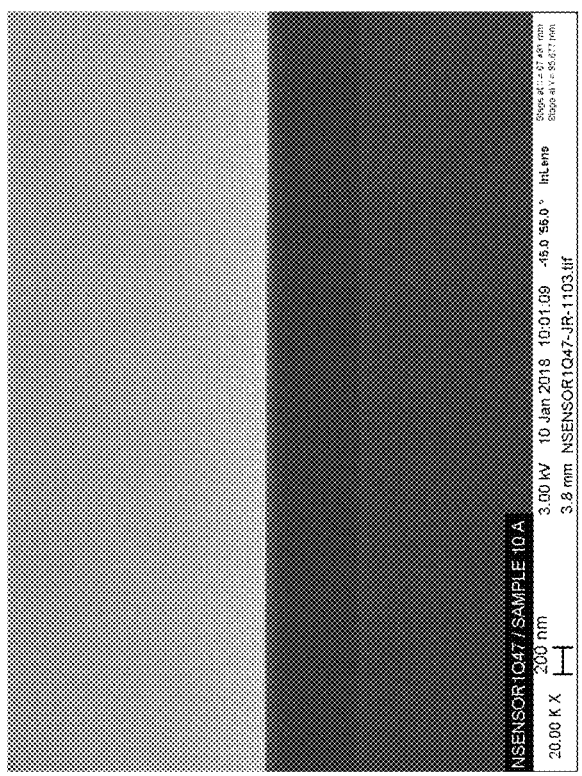
FIG. 11 depicts a scanning electron microscope (SEM) image of a 700 nanometer (nm) glassy carbon film PECVD deposited on a bare silicon wafer at 550° C. with no annealing, according to embodiments of the invention.

FIG. 11 depicts a scanning electron microscope (SEM) image of a 700 nanometer (nm) glassy carbon film PECVD deposited on a bare silicon wafer at 550° C. with no annealing, according to one or more embodiments of the invention. FIG. 12 depicts a scanning electron microscope (SEM) image of a 700 nm glassy carbon film PECVD deposited on a bare silicon wafer at 550° C. with no annealing, according to one or more embodiments of the invention. As shown in FIG. 11 and FIG. 12, the glassy carbon layer 602 is dense with no visible voids and has a smooth surface.

As shown in FIG. 11 and FIG. 12, the carbon layer 602 obtained according to embodiments of the present invention, is dense and void-free even after annealing. The layer 602 can include of $sp^2$ bonded carbon. Shrinkage of the film is minimal (about 7-10%). The IR spectra of provided material are substantially free of peaks between 2800-3100 $cm^{-1}$ associated with $CH_x$ stretch, a FTIR peak at 3048 $cm^{-1}$ associated with $sp^2$ CH bonding can be observed and a peak at 1580 cm–1 associated with C=C aromatic bonding is observed. The raman spectra of the provided glassy carbon material has a doublet of sharp narrow peaks at 1340 and 1600 $cm^{-1}$ associated with the disordered (D) and graphite (G) bands respectively with the I(D)>I(G). Also observed is a weak broad doublet 2200-3200 $cm^{-1}$ associated with double resonant overtones of the D and G peaks, 2D (2625 cm–1) and D+G (2925 cm–1) bands approximately equal in intensity.

Figure 14:
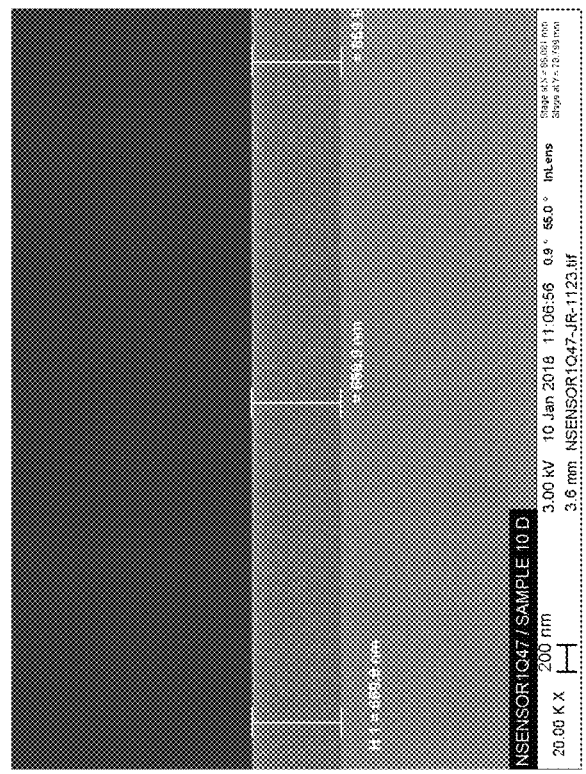
FIG. 14 depicts a scanning electron microscope (SEM) image of a 700 nm glassy carbon film PECVD deposited on a bare silicon wafer at 550° C. with one hour of annealing at 900° C., according to embodiments of the invention.
Figure 13:
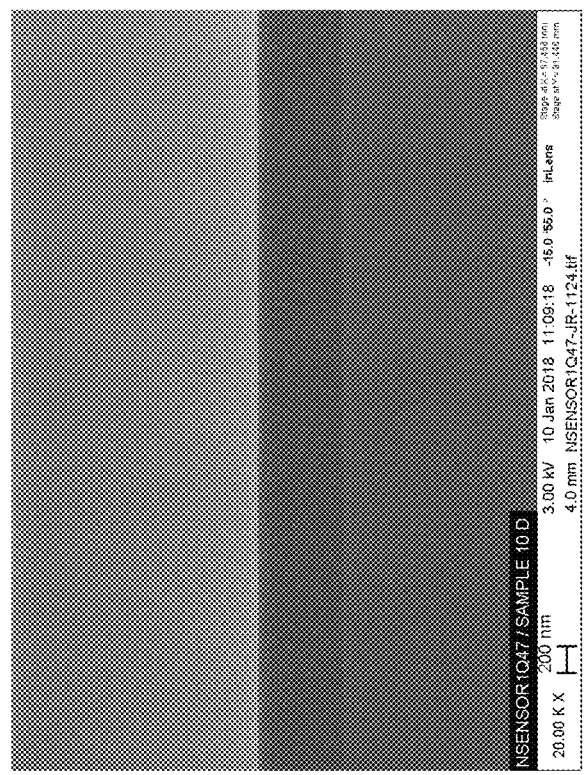
FIG. 13 depicts a scanning electron microscope (SEM) image of a 700 nm glassy carbon film PECVD deposited on a bare silicon wafer at 550° C. with one hour of annealing at 900° C., according to embodiments of the invention.

FIG. 13 depicts a scanning electron microscope (SEM) image of a 700 nm glassy carbon film PECVD deposited on a bare silicon wafer at 550° C. and subjected to one hour of annealing at 900° C., according to one or more embodiments of the invention. FIG. 14 depicts a scanning electron microscope (SEM) image of a 700 nm glassy carbon film PECVD deposited on a bare silicon wafer at 550° C. and subjected to one hour of annealing at 900° C., according to one or more embodiments of the invention.

Figure 15:
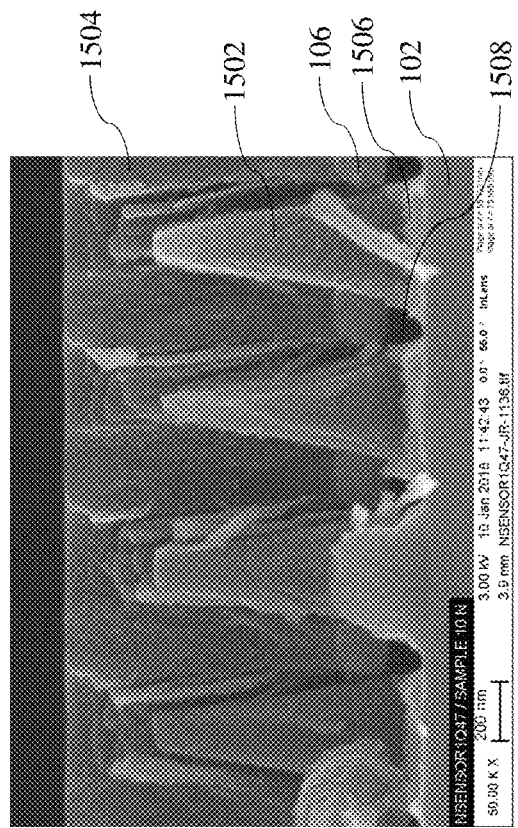
FIG. 15 depicts a SEM image of a glassy carbon film PECVD deposited over patterned $SiN/SiO_2$ layers with no annealing, according to embodiments of the invention.

FIG. 15 depicts a SEM image of a 700 nm glassy carbon film PECVD deposited over patterned $SiN/SiO_2$ layers with no annealing, according to one or more embodiments of the invention. In FIG. 15, carbon pillars 1502 are formed on substrate 102. A silicon nitride layer 106 and some carbon 1504 over silicon nitride 106 can also be seen in FIG. 19. Further, residual silicon oxide material 1506 from the soluble layer 104 can also be seen in FIG. 15. Furthermore, FIG. 15 shows voids 1508 under silicon nitride layer 106 where the PECVD carbon failed to fill.

Figure 16:
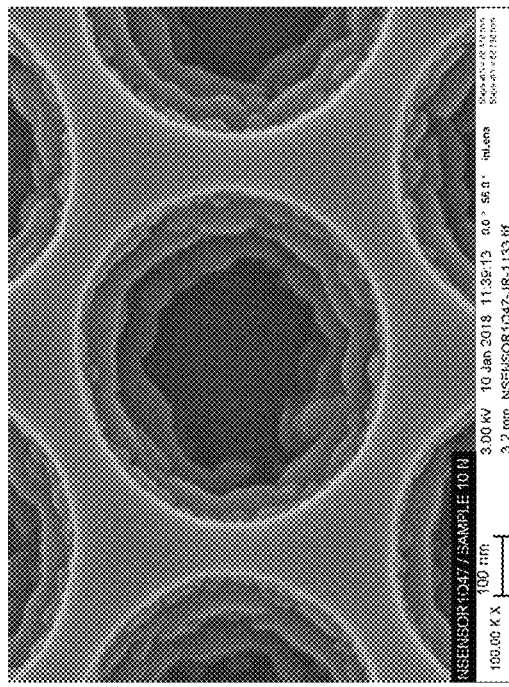
FIG. 16 depicts a top view SEM image of a glassy carbon film PECVD deposited over patterned $SiN/SiO_2$ layers with no annealing, according to embodiments of the invention.

FIG. 16 depicts a top view SEM image of a benzene film CVD deposited over patterned $SiN/SiO_2$ layers with no annealing, according to one or more embodiments of the invention.

Figure 17:
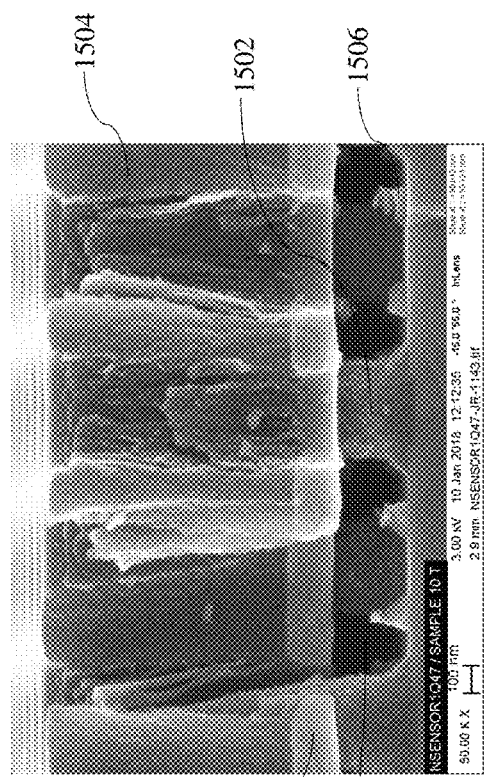
FIG. 17 depicts a SEM image of SiN layer after PECVD deposition of glassy carbon layer over patterned $SiN/SiO_2$ layers with one hour of annealing at 900° C., according to embodiments of the invention.

FIG. 17 depicts a SEM image of SiN layer 106 after PECVD deposition of glassy carbon layer over patterned $SiN/SiO_2$ layers with one hour of annealing at 900° C., according to one or more embodiments of the invention.

Figure 18:
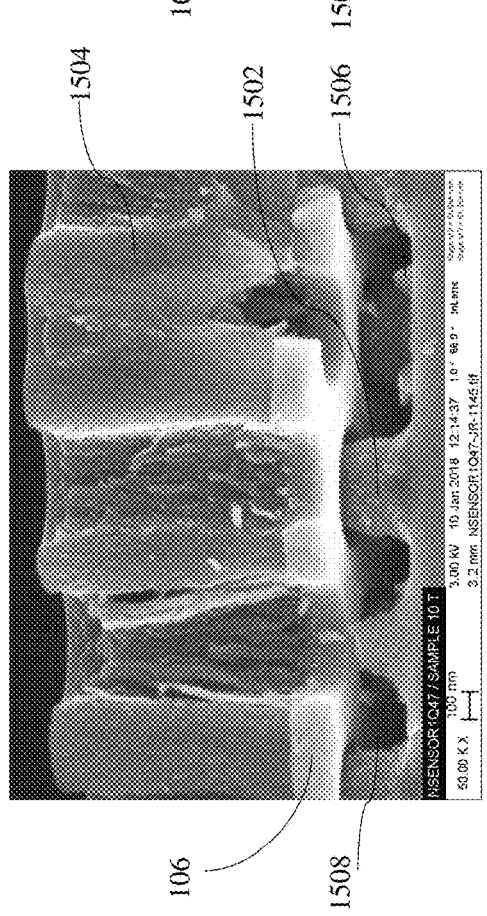
FIG. 18 depicts a SEM image of SiN layer after PECVD deposition of glassy carbon layer over patterned $SiN/SiO_2$ layers with one hour of annealing at 900° C., according to embodiments of the invention.

FIG. 18 depicts a SEM image of SiN layer 106 after PECVD deposition of glassy carbon layer over patterned SiN/SiO$_2$ layers with one hour of annealing at 900° C., according to one or more embodiments of the invention.

FIG. 19 depicts a flow diagram illustrating a methodology 1900 according to one or more embodiments of the present invention. At block 1902, a soluble layer 104 is formed on a substrate 102. At block 1904, a lift-off mask layer 106 is formed on the soluble layer 106. At block 1906, a hard-mask layer 108 is formed on the lift-off mask layer 106. At block 1908, a resist pattern 110 is formed on the hard-mask layer 108. At block 1910, a pattern is formed in the hard-mask layer 108. At block 1912, the resist pattern 110 is removed. At block 1914, exposed portions of lift-off mask layer 106 are removed. At block 1916, exposed portions of the soluble layer 104 are removed thereby exposing portions of the substrate 102. At block 1918, a carbon material is deposited over the exposed portions of the substrate 102. At block 1920, the soluble layer is dissolved and removed. At block 1922, the lift-off mask layer and the hard-mask layer are lifted-off.

Various connections and positional relationships (e.g., over, below, adjacent, etc.) are set forth between elements in the following description and in the drawings. These connections and/or positional relationships, unless specified otherwise, can be direct or indirect, and the present invention is not intended to be limiting in this respect. Accordingly, a coupling of entities can refer to either a direct or an indirect coupling, and a positional relationship between entities can be a direct or indirect positional relationship. As an example of an indirect positional relationship, references in the present description to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiments or designs. The terms "at least one" and "one or more" are understood to include any integer number greater than or equal to one, i.e. one, two, three, four, etc. The terms "a plurality" are understood to include any integer number greater than or equal to two, i.e. two, three, four, five, etc. The term "connection" can include an indirect "connection" and a direct "connection."

Spatially relative terms, e.g., "beneath," "below," "lower," "above," "upper," and the like, are used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device can be otherwise oriented (e.g., rotated 90 degrees or at other orientations), and the spatially relative descriptors used herein should be interpreted accordingly.

The term "film" as used herein is intended to include any suitable structure or shape that can be prepared by depositing a carbon material. In particular, the term "glassy carbon film" is intended to include a glassy carbon electrode of any suitable shape. Throughout the specification, the terms "glassy carbon film" and "glassy carbon electrode" are used synonymously and interchangeably.

As previously noted herein, for the sake of brevity, conventional techniques related to semiconductor device and integrated circuit (IC) fabrication may or may not be described in detail herein. By way of background, however, a more general description of the semiconductor device fabrication processes that can be utilized in implementing one or more embodiments of the present invention will now be provided. Although specific fabrication operations used in implementing one or more embodiments of the present invention can be individually known, the described combination of operations and/or resulting structures of the present invention are unique. Thus, the unique combination of the operations described in connection with the fabrication of a semiconductor device according to the present invention utilize a variety of individually known physical and chemical processes performed on a semiconductor (e.g., silicon) substrate, some of which are described in the immediately following paragraphs.

In general, the various processes used to form a semiconductor device fall into four general categories, namely, film deposition, removal/etching, semiconductor doping and patterning/lithography. Deposition is any process that grows, coats, or otherwise transfers a material onto the wafer. Available technologies include physical vapor deposition (PVD), chemical vapor deposition (CVD), plasma enhanced chemical vapor deposition (PECVD), electrochemical deposition (ECD), molecular beam epitaxy (MBE) and more recently, atomic layer deposition (ALD) among others. Removal/etching is any process that removes material from the wafer. Examples include etch processes (either wet or dry), and chemical-mechanical planarization (CMP), and the like. Semiconductor doping is the modification of electrical properties by doping, for example, transistor sources and drains, generally by diffusion and/or by ion implantation. These doping processes are followed by furnace annealing or by rapid thermal annealing (RTA). Annealing serves to activate the implanted dopants. Films of both conductors (e.g., poly-silicon, aluminum, copper, etc.) and insulators (e.g., various forms of silicon dioxide, silicon nitride, etc.) are used to connect and isolate transistors and their components. Selective doping of various regions of the semiconductor substrate allows the conductivity of the substrate to be changed with the application of voltage. By creating structures of these various components, millions of transistors can be built and wired together to form the complex circuitry of a modern microelectronic device. Semiconductor lithography is the formation of three-dimensional relief images or patterns on the semiconductor substrate for subsequent transfer of the pattern to the substrate. In semiconductor lithography, the patterns are formed by a light sensitive polymer called a photo-resist. To build the complex structures that make up a transistor and the many wires that connect the millions of transistors of a circuit, lithography and etch pattern transfer steps are repeated multiple times. Each pattern being printed on the wafer is aligned to the previously formed patterns and slowly the conductors, insulators and selectively doped regions are built up to form the final device.

The flowchart and block diagrams in the Figures illustrate possible implementations of fabrication and/or operation methods according to various embodiments of the present invention. Various functions/operations of the method are represented in the flow diagram by blocks. In some alternative implementations, the functions noted in the blocks can occur out of the order noted in the Figures. For example, two blocks shown in succession can, in fact, be executed substantially concurrently, or the blocks can sometimes be executed in the reverse order, depending upon the functionality involved.

References in the specification to "one embodiment," "an embodiment," "an example embodiment," etc., indicate that the embodiment described can include a particular feature, structure, or characteristic, but every embodiment may or may not include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

The phrase "selective to," such as, for example, "a first element selective to a second element," means that the first element can be etched and the second element can act as an etch stop.

The terms "about," "substantially," "approximately," and variations thereof, are intended to include the degree of error associated with measurement of the particular quantity based upon the equipment available at the time of filing the application. For example, "about" can include a range of ±8% or 5%, or 2% of a given value.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein.

What is claimed is:

1. A method of fabricating glassy carbon film, the method comprising:

forming a soluble layer on a substrate, the soluble layer comprising an oxide that is soluble in water or a hydrogen fluoride solution comprising hydrogen fluoride and water;

forming a lift-off stack on the soluble layer, the lift-off stack comprising a lift-off mask layer and a hard-mask layer;

forming a pattern in the lift-off stack to expose a portion of the soluble layer;

recessing the exposed portion of the soluble layer by about 70% to about 90% using reactive ion etching;

removing the exposed portions of the soluble layer using a wet etch comprising water or the hydrogen fluoride solution to expose a portion of the substrate and sidewalls of remaining portions of the soluble layer, wherein the removing also forms an undercut portion under the lift-off mask layer where some of the unexposed portion of the soluble layer is removed;

depositing a carbon material over the exposed portion of the substrate using plasma enhanced chemical vapor deposition (PECVD) of benzene such that exposed top surfaces of the substrate below the undercut portion remain between sidewalls of the carbon material and sidewalls of the remaining portions of the soluble layer, the carbon material forming a glassy carbon film having $sp^2$ bonded carbon and a disordered (D) band having a greater intensity than a graphite (G) band; and dissolving the soluble layer in a solvent comprising water or the hydrogen fluoride solution, and lifting-off the lift-off stack.

2. The method of claim 1, wherein the hard mask comprises titanium hard-mask.

3. The method of claim 1, wherein the lift-off mask layer comprises silicon nitride.

4. The method of claim 1, wherein the oxide is selected from the group consisting of silicon oxide, germanium oxide, blend of silicon-germanium oxides, tungsten oxide, and combinations thereof.

5. The method of claim 1, wherein the substrate is selected from the group consisting of silicon, germanium nitride, sapphire, and combinations thereof.

6. The method of claim 1 further comprising annealing the deposited carbon material.

7. The method of claim 6, wherein the annealing is carried out at a temperature of about 600 to about 1000° C.

8. The method of claim 6, wherein the annealing is carried out for a period of about 30 minutes to about 4 hours.

9. The method of claim 1, wherein forming a pattern in the lift-off stack comprises removing a portion of the hard-mask by reactive ion etching using chlorine plasma.

10. The method of claim 1, wherein forming a pattern in the lift-off stack comprises removing a portion of the lift-off mask layer by reactive ion etching using fluorine plasma.

11. The method of claim 1, wherein forming a pattern in the lift-off stack comprises forming a pattern in the hard-mask using a resist pattern.

* * * * *